(12) United States Patent
Reznicek et al.

(10) Patent No.: US 10,748,994 B2
(45) Date of Patent: Aug. 18, 2020

(54) VERTICALLY STACKED NFET AND PFET WITH DUAL WORK FUNCTION

(71) Applicant: International Business Machines Corporation, Armonk, NY (US)

(72) Inventors: Alexander Reznicek, Troy, NY (US); Takashi Ando, Eastchester, NY (US); Jingyun Zhang, Albany, NY (US); Choonghyun Lee, Rensselaer, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/564,823

(22) Filed: Sep. 9, 2019

(65) Prior Publication Data

US 2019/0393307 A1    Dec. 26, 2019

Related U.S. Application Data

(63) Continuation of application No. 15/801,967, filed on Nov. 2, 2017, now Pat. No. 10,546,925.

(51) Int. Cl.
*H01L 29/06* (2006.01)
*H01L 21/8238* (2006.01)
(Continued)

(52) U.S. Cl.
CPC .... *H01L 29/0673* (2013.01); *H01L 21/02532* (2013.01); *H01L 21/28088* (2013.01);
(Continued)

(58) Field of Classification Search
CPC ............. H01L 29/0673; H01L 29/0653; H01L 29/0847; H01L 29/16; H01L 29/42392;
(Continued)

(56) References Cited

U.S. PATENT DOCUMENTS

| 9,354,408 B2 | 5/2016 | Noma et al. |
| 9,362,283 B2 | 6/2016 | Hong et al. |

(Continued)

OTHER PUBLICATIONS

List of IBM Patents or Patent Applications Treated as Related Dated Sep. 9, 2019, 2 Pages.

(Continued)

*Primary Examiner* — Tong-Ho Kim
(74) *Attorney, Agent, or Firm* — Scully, Scott, Murphy & Presser, P.C; L. Jeffrey Kelly, Esq.

(57) ABSTRACT

A semiconductor structure is provided that includes a pFET device including a first functional gate structure containing at least a p-type work function metal and present on physically exposed surfaces, and between, each Si channel material nanosheet of a first set of vertically stacked and suspended Si channel material nanosheets. The structure further includes an nFET device stacked vertically above the pFET device. The nFET device includes a second functional gate structure containing at least an n-type work function metal present on physically exposed surfaces, and between, each Si channel material nanosheet of a second set of vertically stacked and suspended Si channel material nanosheets.

17 Claims, 14 Drawing Sheets

(51) Int. Cl.
| | |
|---|---|
| *H01L 29/16* | (2006.01) |
| *H01L 29/423* | (2006.01) |
| *H01L 29/08* | (2006.01) |
| *H01L 29/49* | (2006.01) |
| *H01L 21/02* | (2006.01) |
| *H01L 21/306* | (2006.01) |
| *H01L 29/66* | (2006.01) |
| *H01L 21/28* | (2006.01) |
| *H01L 21/285* | (2006.01) |
| *H01L 27/12* | (2006.01) |
| *H01L 29/786* | (2006.01) |
| *H01L 21/84* | (2006.01) |
| *H01L 27/092* | (2006.01) |
| *H01L 27/06* | (2006.01) |
| *H01L 29/775* | (2006.01) |
| *H01L 21/822* | (2006.01) |

(52) U.S. Cl.
CPC .. *H01L 21/28556* (2013.01); *H01L 21/30604* (2013.01); *H01L 21/8221* (2013.01); *H01L 21/823814* (2013.01); *H01L 21/823828* (2013.01); *H01L 21/823842* (2013.01); *H01L 21/823871* (2013.01); *H01L 21/84* (2013.01); *H01L 27/0688* (2013.01); *H01L 27/092* (2013.01); *H01L 27/1203* (2013.01); *H01L 29/0653* (2013.01); *H01L 29/0847* (2013.01); *H01L 29/16* (2013.01); *H01L 29/42392* (2013.01); *H01L 29/4908* (2013.01); *H01L 29/66545* (2013.01); *H01L 29/66553* (2013.01); *H01L 29/66742* (2013.01); *H01L 29/775* (2013.01); *H01L 29/78651* (2013.01); *H01L 21/823807* (2013.01)

(58) Field of Classification Search
CPC ........... H01L 29/4908; H01L 29/66545; H01L 29/66553; H01L 29/66742; H01L 1121/02532; H01L 29/28088; H01L 29/28556; H01L 29/30604; H01L 29/823814; H01L 29/823828; H01L 29/823871
USPC .......................................................... 257/351
See application file for complete search history.

(56) References Cited

U.S. PATENT DOCUMENTS

| | | | |
|---|---|---|---|
| 9,659,963 | B2 | 5/2017 | Cheng et al. |
| 9,761,684 | B2 | 9/2017 | Huang et al. |
| 9,837,414 | B1 | 12/2017 | Balakrishnan et al. |
| 2012/0146159 | A1 | 6/2012 | Wang et al. |
| 2015/0372115 | A1* | 12/2015 | Koh .................... H01L 29/6656 438/301 |
| 2015/0372145 | A1* | 12/2015 | Cheng ................. H01L 29/1033 257/288 |
| 2016/0307928 | A1* | 10/2016 | Liu .................... H01L 27/1211 |
| 2017/0040321 | A1 | 2/2017 | Mitard |
| 2017/0133507 | A1 | 5/2017 | Cheng et al. |

OTHER PUBLICATIONS

Notice of Allowance dated Mar. 5, 2020 received in U.S. Appl. No. 16/564,795.

* cited by examiner

US 10,748,994 B2

VERTICALLY STACKED NFET AND PFET WITH DUAL WORK FUNCTION

BACKGROUND

The present application relates to a semiconductor structure and a method of forming the same. More particularly, the present application relates to a semiconductor structure including vertically stacked n-type field effect transistors (nFETs) containing an n-type work function metal gate and p-type field effect transistors (pFETs) containing a p-type work function metal gate, and a method of forming the same.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Also, three dimensional (3D) integration by vertically stacking nFETs and pFETs is an attractive approach for 3 nm node and beyond area scaling. Such vertically stacking of nFETs and pFETs combined with nanosheet technology can benefit from device electrostatics control in addition to area scaling. One problem associated with prior art devices that contain a combination of vertically stacked nFETs and pFETs and nanosheet technology is that independent work functional control for nFETs and pFETs is not possible. There is thus a need for providing a method that combines vertically stacked nFETs and pFETs and nanosheet technology that can implement independent work function metal gates for the nFETs and pFETs.

SUMMARY

A semiconductor structure including vertically stacked nFETs and pFETs containing Si channel material nanosheets and independent work function metal gates for the nFETs and pFETs is provided together with a method of forming such a structure.

In one aspect of the present application, a semiconductor structure is provided. In one embodiment, the semiconductor structure includes a pFET device including a first functional gate structure containing at least a p-type work function metal and present on physically exposed surfaces, and between, each Si channel material nanosheet of a first set of vertically stacked and suspended Si channel material nanosheets. An nFET device is stacked vertically above the pFET device. The nFET device includes a second functional gate structure containing at least an n-type work function metal and present on physically exposed surfaces, and between, each Si channel material nanosheet of a second set of vertically stacked and suspended Si channel material nanosheets.

In another aspect, a method of forming a semiconductor structure is provided. In one embodiment the method includes forming a vertical stack of a first nanosheet stack of alternating nanosheets of a sacrificial SiGe nanosheet and a Si channel material nanosheet and a second nanosheet stack of alternating nanosheets of a sacrificial SiGe nanosheet and a Si channel material nanosheet, wherein the vertical stack is present above a semiconductor substrate and beneath a sacrificial gate structure and a dielectric spacer. Next, each sacrificial SiGe nanosheet of the first and second nanosheet stacks is recessed. The sacrificial gate structure and each recessed sacrificial SiGe nanosheet of the first and second nanosheet stacks are then removed to suspend each Si channel material nanosheet and to provide a gate cavity. A gate dielectric material is then formed in the gate cavity and on physically exposed surfaces of each suspended Si channel material nanosheet. A p-type work function metal is then formed on the gate dielectric material. Next, the p-type work function metal is removed from the gate cavity present below and above each suspended Si channel material nanosheet of the second nanosheet stack. An n-type work function metal is formed in the gate cavity present between and above each suspended Si channel material nanosheet of the second nanosheet stack.

DETAILED DESCRIPTION

Figure 1:
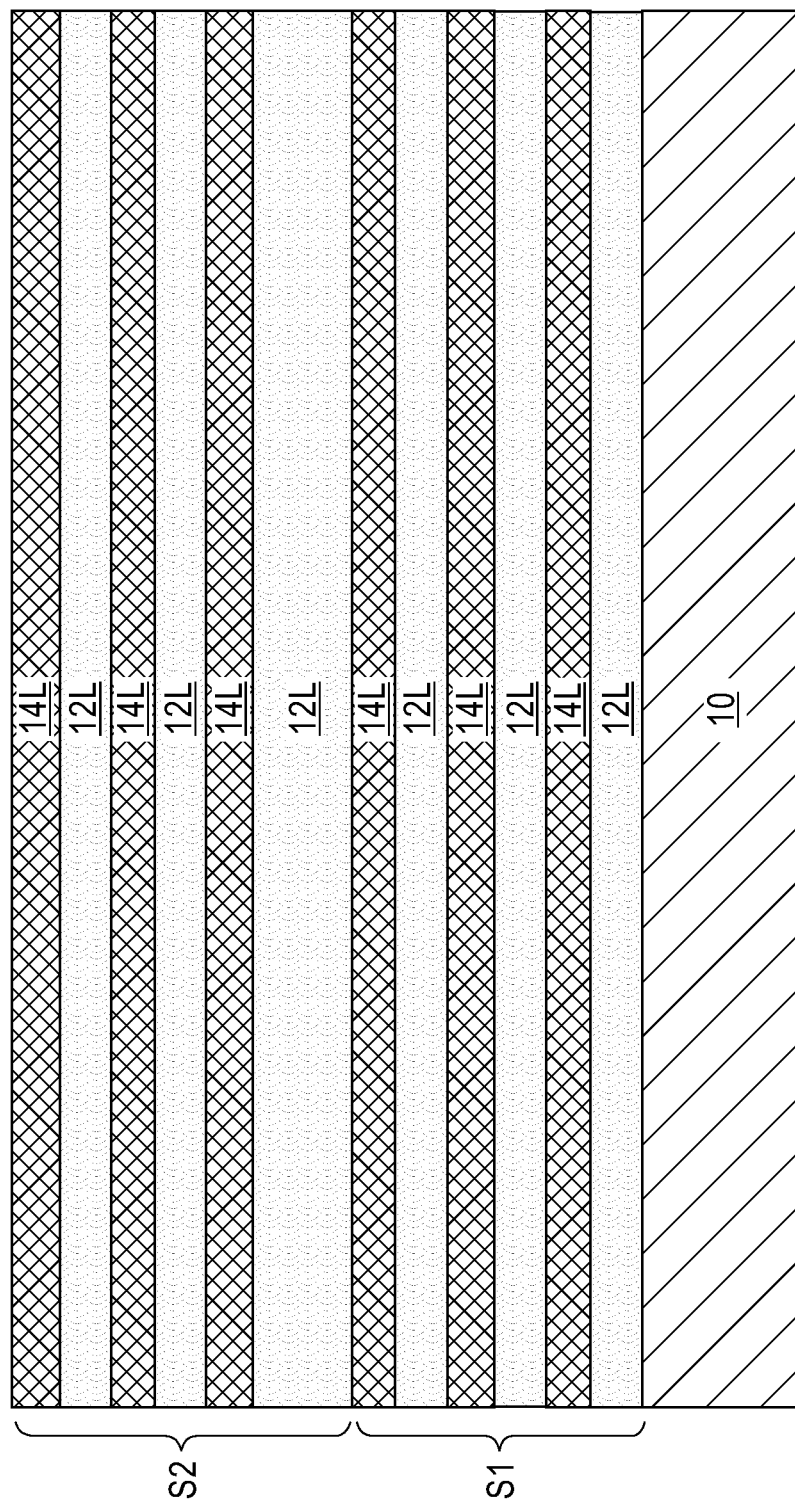
FIG. 1 is a cross sectional view of an exemplary semiconductor structure at an early stage of fabrication in accordance with an embodiment of the present application and including a first semiconductor material stack of alternating layers of a sacrificial silicon germanium (SiGe) layer and a silicon (Si) channel material layer, and a second semiconductor material stack of alternating layers of a sacrificial SiGe layer and a Si channel material layer, wherein the first semiconductor material stack is located on a topmost surface of a semiconductor substrate, and the second semiconductor material stack is located on a topmost surface of the first semiconductor material stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure at an early stage of fabrication in accordance with an embodiment of the present application. The exemplary semiconductor structure of FIG. 1 includes a first semiconductor material stack, S1, of alternating layers of a sacrificial silicon germanium (SiGe) layer 12L and a silicon (Si) channel material layer 14L, and a second semiconductor material stack, S2, of alternating layers of a sacrificial SiGe alloy layer 12L and a Si channel material layer 14L. As is shown, the first semiconductor material stack, S1, is located on a topmost surface of a semiconductor substrate 10, and the second semiconductor material stack, S2, is located on a topmost surface of the first material stack, S1.

In the present application, the first semiconductor material stack, S1, is used in providing vertically stacked and suspended Si channel material nanosheets for a pFET device, while the second semiconductor material stack, S2, is used in providing vertically stacked and suspended Si channel material nanosheets for an nFET device.

The semiconductor substrate 10 may include any semiconductor material including, for example, silicon. The term "semiconductor material" is used throughout the present application to denote a material that has semiconducting properties. Besides silicon, the semiconductor material may be germanium (Ge), a silicon germanium alloy (SiGe), silicon carbide (SiC), silicon germanium carbide (SiGeC), III-V compound semiconductors or II-VI compound semiconductors.

The first and second semiconductor material stacks (S1, S2) are then sequentially formed upon the semiconductor substrate 10. As mentioned above, the first and second semiconductor material stacks (S1, S2) include sacrificial SiGe layers 12L and Si channel material layers 14L which alternate one atop the other. In FIG. 1 and by way of one example, each of the first and second semiconductor material stacks (S1, S2) includes three sacrificial SiGe layers 12L and three Si channel material layers 14L. The first and second semiconductor material stacks (S1, S2) that can be employed in the present application are not limited to the specific embodiment illustrated in FIG. 1. Instead, the first and second semiconductor material stacks (S1, S2) can include any number of sacrificial SiGe layers 12L and corresponding Si channel material layers 14L so long as each of the first and second semiconductor material stacks (S1, S2) includes at least two sacrificial SiGe layers 12L and two Si channel material layers 14L.

Each sacrificial SiGe layer 12L is composed of a silicon germanium alloy having a germanium content which may range from 20 atomic percent germanium to 40 atomic percent germanium. Each Si channel material layer 14L is composed of unalloyed silicon. The silicon germanium alloy that provides each sacrificial SiGe layer 12L can be formed utilizing an epitaxial growth (or deposition process) as defined in greater detail herein below. The unalloyed silicon that provides each Si channel material layer 14L can be formed utilizing an epitaxial growth (or deposition process) as defined in greater detail herein below.

The first and second semiconductor material stacks (S1, S2) can be formed by sequential epitaxial growth of alternating layers of the SiGe alloy and the unalloyed silicon. Following epitaxial growth of the topmost layer of the second semiconductor material stack, S2, a patterning process may be used to provide the first and second semiconductor material stacks (S1, S2) shown in FIG. 1. Patterning may be achieved by lithography and etching as is well known to those skilled in the art.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growths described herein can be performed utilizing any well known precursor gas or gas mixture. Carrier gases like hydrogen, nitrogen, helium and argon can be used.

Each sacrificial SiGe layer 12L may have a thickness from 6 nm to 12 nm, while each Si channel material layer 14L may have a thickness from 5 to 12 nm. In the present application, the bottommost sacrificial SiGe layer 12L in the second semiconductor material stack, S2, has a thickness that is generally greater than the thickness of the other sacrificial SiGe layers within the first and second semiconductor material stacks (S1, S2). By providing a thick sacrificial SiGe layer at the bottommost layer of the second semiconductor material stack, S2, sufficient isolation can be provided between the subsequently formed vertically stacked pFET and nFET device regions.

Figure 2:
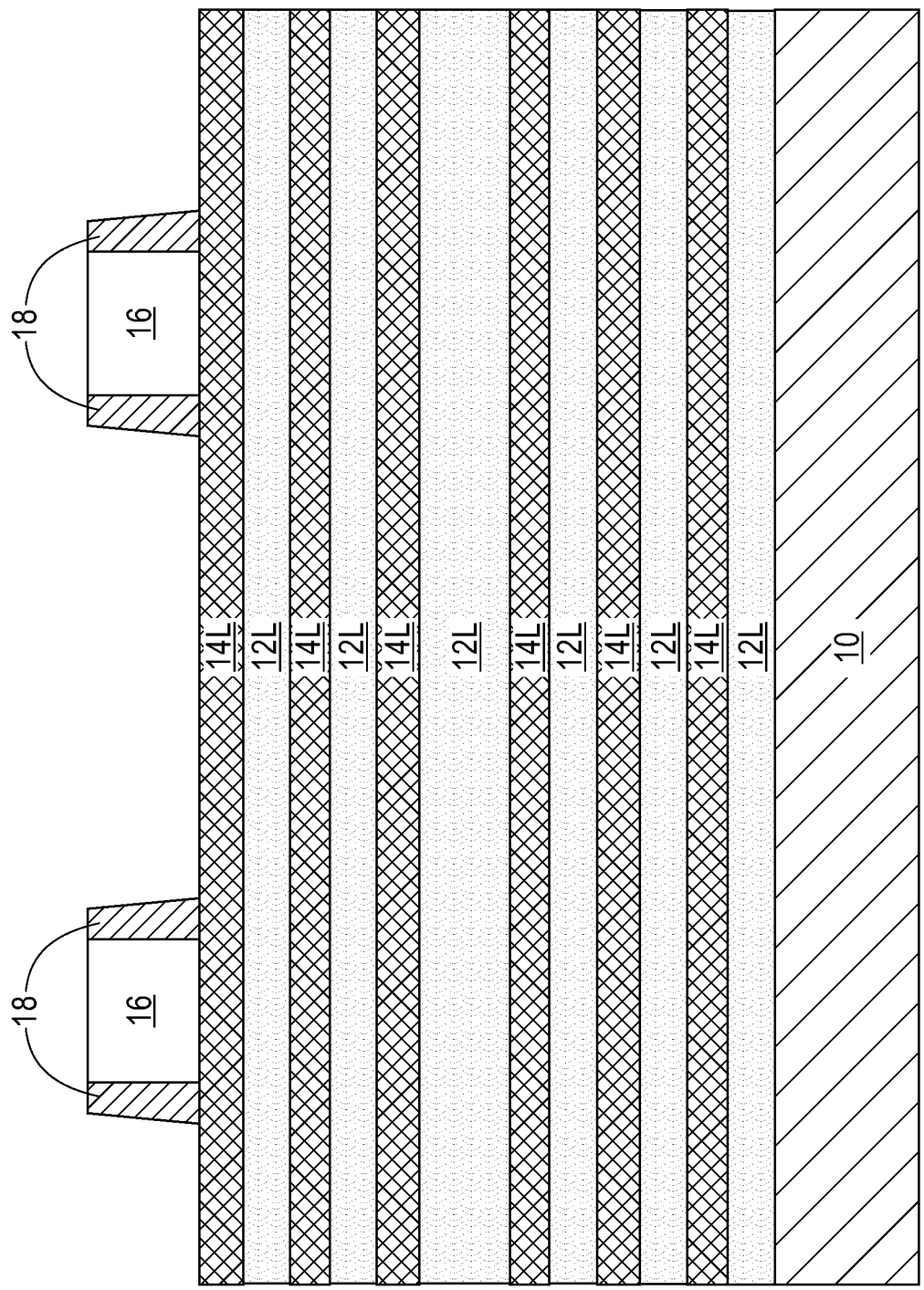
FIG. 2 is a cross sectional view of the exemplary semiconductor structure of FIG. 1 after forming at least one sacrificial gate structure and a dielectric spacer.

Referring now to FIG. 2, there is illustrated the exemplary semiconductor structure of FIG. 1 after forming at least one sacrificial gate structure 16 and a dielectric spacer 18. By way of illustration, two sacrificial gate structures 16 are exemplified in the drawings of the present application. Although not shown, each sacrificial gate structure 16 is located on a first side and a second side of the first and second semiconductor material stacks (S1, S2) and spans across a topmost surface of a portion of the second semiconductor material stack, S2. Each sacrificial gate stack 16 thus straddles over a portion of the first and second semiconductor material stacks (Si, S2). The dielectric spacer layer 18 is present on sidewalls of each sacrificial gate structure 16; the dielectric spacer 18 also straddles over the first and second semiconductor material stacks (S1, S2).

It is noted that in the drawings of the present application, the sacrificial gate structures 16 and dielectric spacer 18 are only shown as being present atop, not along sidewalls, of the first and second semiconductor material stacks (S1, S2). This was done for clarity and to illustrate the nanosheet stacks that are formed beneath the sacrificial gate structures 16 and the dielectric spacer 18.

Each sacrificial gate structure 16 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the at least one sacrificial gate structure 16. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 16, the dielectric spacer 18 can be formed. The dielectric spacer 18 can be formed by first providing a dielectric spacer material and then etching the dielectric spacer material. One example of a dielectric spacer material that may be employed in the present application is silicon nitride or silicon dioxide.

The dielectric spacer material that provides the dielectric spacer 18 may be provided by a deposition process including, for example, chemical vapor deposition (CVD), plasma enhanced chemical vapor deposition (PECVD), or physical vapor deposition (PVD). The etch used to provide the dielectric spacer 18 may comprise a dry etching process such as, for example, reactive ion etching.

Figure 3:
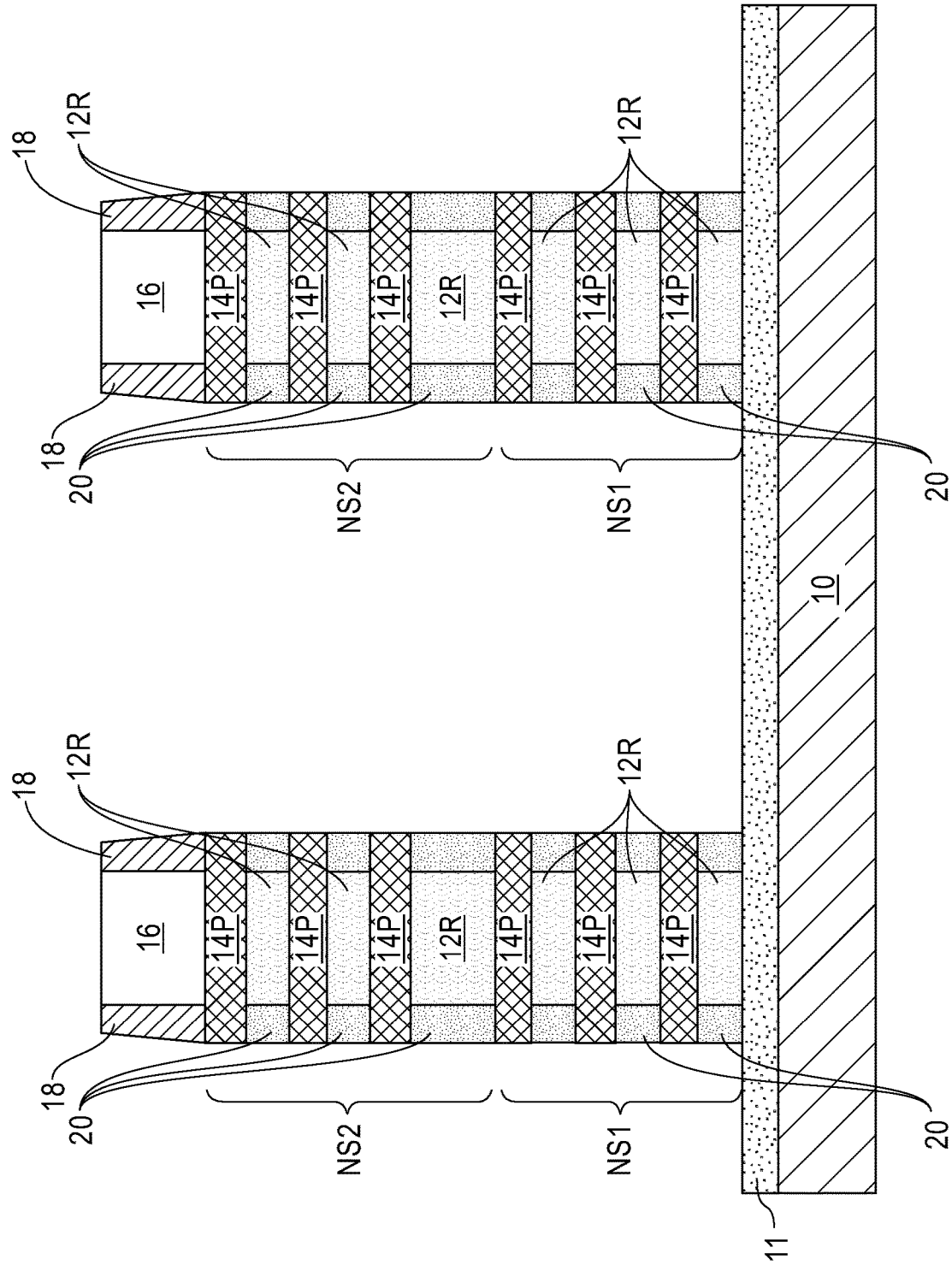
FIG. 3 is a cross sectional view of the exemplary semiconductor structure of FIG. 2 after forming a first nanosheet stack of alternating nanosheets of a sacrificial SiGe nanosheet and a Si channel material nanosheet, and a second nanosheet stack of alternating nanosheets of a sacrificial SiGe nanosheet and a Si channel material nanosheet under the least one sacrificial gate structure and the dielectric spacer by removing physically exposed portions of the first and second semiconductor material stacks that are not protected by the least one sacrificial gate structure and the dielectric spacer, recessing each sacrificial SiGe nanosheet, forming an inner spacer within a gap formed by the recessing of each sacrificial SiGe nanosheet, and forming a dielectric isolation layer.

Referring now to FIG. 3, there is illustrated the exemplary semiconductor structure of FIG. 2 after forming a first nanosheet stack, NS1, of alternating nanosheets of a sacrificial SiGe nanosheet and a Si channel material nanosheet 14P and a second nanosheet stack, NS2, of alternating nanosheets of a sacrificial SiGe nanosheet and a Si channel material nanosheet 14P under the least one sacrificial gate structure 16 and the dielectric spacer 18, recessing each sacrificial SiGe nanosheet to provide recessed sacrificial SiGe nanosheets 12R, forming an inner spacer 20 within a gap formed by the recessing of each sacrificial SiGe nanosheet, and forming a dielectric isolation layer 11.

The first and second first nanosheet stacks (NS1, NS2) can be formed by removing physically exposed portions of the first and second semiconductor material stacks (S1, S2) that are not protected by the least one sacrificial gate structure 16 and the dielectric spacer 18. The removal of the portions of the first and second semiconductor material stacks (S1, S2) not covered by the least one sacrificial gate structure 16 and the dielectric spacer 18 can be performed utilizing an anisotropic etching process such as, for example, reactive ion etching (RIE). Portions of the first and second semiconductor material stacks (S1, S2) remain beneath the least one sacrificial gate structure 16 and the dielectric spacer 18. The remaining portion of the first semiconductor material stack, S1, which is present beneath the least one sacrificial gate structure 16 and the dielectric spacer material layer 18, is referred to as a first nanosheet stack, NS1. The remaining portion of the second semiconductor material stack, S2, that is present beneath the least one sacrificial gate structure 16 and the dielectric spacer material layer 18 and atop the first nanosheet stack, NS1, is referred to as a second nanosheet stack, NS2.

The first and second nanosheet stacks (NS1, NS2) include alternating nanosheets of remaining portions of each sacrificial SiGe layer (referred to herein as sacrificial SiGe nanosheets) and remaining portions of each Si channel material layer (referred to herein as Si channel material nanosheets 14P); the sacrificial SiGe nanosheets are not specifically labeled since they will be subsequently recessed to provide recessed sacrificial SiGe nanosheets 12R.

Each nanosheet, i.e., sacrificial SiGe nanosheet and Si channel material nanosheet 14P, that constitutes the first and second nanosheet stacks (NS1, NS2) has a thickness as mentioned above for the individual sacrificial SiGe layers 12L and Si channel material layers 14L, and a width from 30 nm to 200 nm. At this point of the present application, the sidewalls of each sacrificial SiGe nanosheet are vertically aligned to sidewalls of each Si channel material nanosheet 14P, and the vertically aligned sidewalls of the first and second nanosheet stacks (NS1, NS2) are vertically aligned to an outermost sidewall of the dielectric spacer 18.

Next, and as also shown in FIG. 3, each sacrificial SiGe nanosheet within the first and second nanosheet stacks (NS1, NS2) is recessed to provide a recessed sacrificial SiGe nanosheet 12R. Each recessed sacrificial SiGe nanosheet 12R has a width that is less than the original width of each sacrificial SiGe nanosheet. The recessing of each sacrificial SiGe nanosheet provides a gap (not specifically shown) between each neighboring pair of Si channel material nanosheets 14P within a given first and second nanosheet stacks (NS1, NS2). The recessing of each sacrificial SiGe nanosheet may be performed utilizing a lateral etching process that is selective in removing physically exposed end portions of each sacrificial SiGe nanosheet relative to each Si channel material nanosheet 14P.

An inner spacer 20, as shown in FIG. 3, is formed into each gap created by the recessing of each sacrificial SiGe nanosheet. The inner spacer 20 may be formed by deposition of a dielectric spacer material and etching such as, for example, RIE. The dielectric spacer material that provides the inner spacer 20 may be the same as, or different from, the dielectric spacer material that provides dielectric spacer 18. The inner spacers 20 have an inner sidewall that directly contacts a sidewall of one of the recessed sacrificial SiGe nanosheet 12R, and an outer sidewall that is vertically aligned to an outer sidewall of each Si channel material nanosheet 14P.

Dielectric isolation layer 11 can then be formed. Dielectric isolation layer 11 may be formed by etching an upper portion of the semiconductor substrate 10 and thereafter depositing a dielectric material such as, for example, silicon dioxide. An etch back process may follow the deposition of the dielectric material that provides the dielectric isolation layer 11. Dielectric isolation layer 11 is present between the first nanosheet stack, NS1, and a remaining portion of the semiconductor substrate 10. During the etching of the upper portion of the semiconductor substrate 10, the first and second nanosheet stacks (NS1, NS2) are anchored by the sacrificial gate structure 16 and the dielectric spacer 18.

Figure 4:
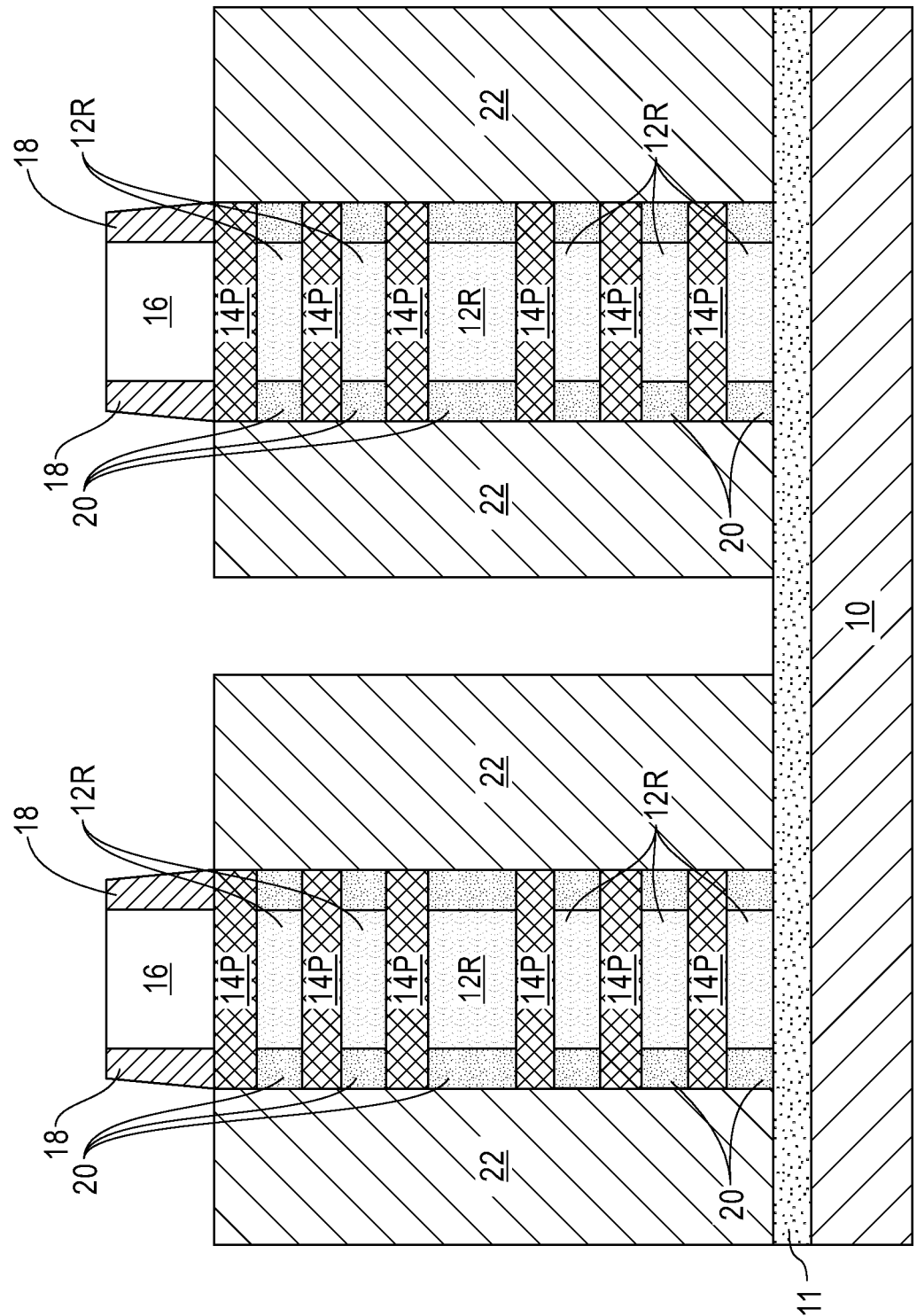
FIG. 4 is a cross sectional view of the exemplary semiconductor structure of FIG. 3 after forming a pFET S/D semiconductor material by epitaxial growth on physically exposed sidewalls of each Si channel material nanosheet.

Referring now to FIG. 4, there is illustrated the exemplary semiconductor structure of FIG. 3 after forming a pFET S/D semiconductor material 22 by epitaxial growth on physically exposed sidewalls of each Si channel material nanosheet 14P. In the present application, the pFET S/D semiconductor material 22 grows laterally out from the sidewalls of each Si channel material nanosheet 14P. No bottom up growth is observed due to the presence of the dielectric isolation structure 11.

The pFET S/D semiconductor material 22 is formed on each side of the first and second naonsheet stacks (NS1, NS2). The pFET S/D semiconductor material 22 includes a semiconductor material and a p-type dopant. The semiconductor material that provides the pFET S/D semiconductor material 22 typically comprises a different semiconductor material than that which provides each Si channel material nanosheet 14P. For example, the semiconductor material that provides pFET S/D semiconductor material 22 may comprise a silicon germanium alloy which may have a higher germanium content than the recessed sacrificial SiGe nanosheets 12R.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. In one embodiment, the p-type dopant that can be present in the pFET S/D semiconductor material 22 can be introduced into the precursor gas that provides the pFET S/D semiconductor material 22. In another embodiment, the dopant can be introduced into an intrinsic semiconductor layer by utilizing one of ion implantation or gas phase doping. In one example, the pFET S/D semiconductor material 22 includes silicon germanium that is doped with boron (i.e., B doped SiGe). As mentioned above, pFET S/D semiconductor material 22 is formed by an epitaxial growth (or deposition) process, as is defined above.

Figure 5:
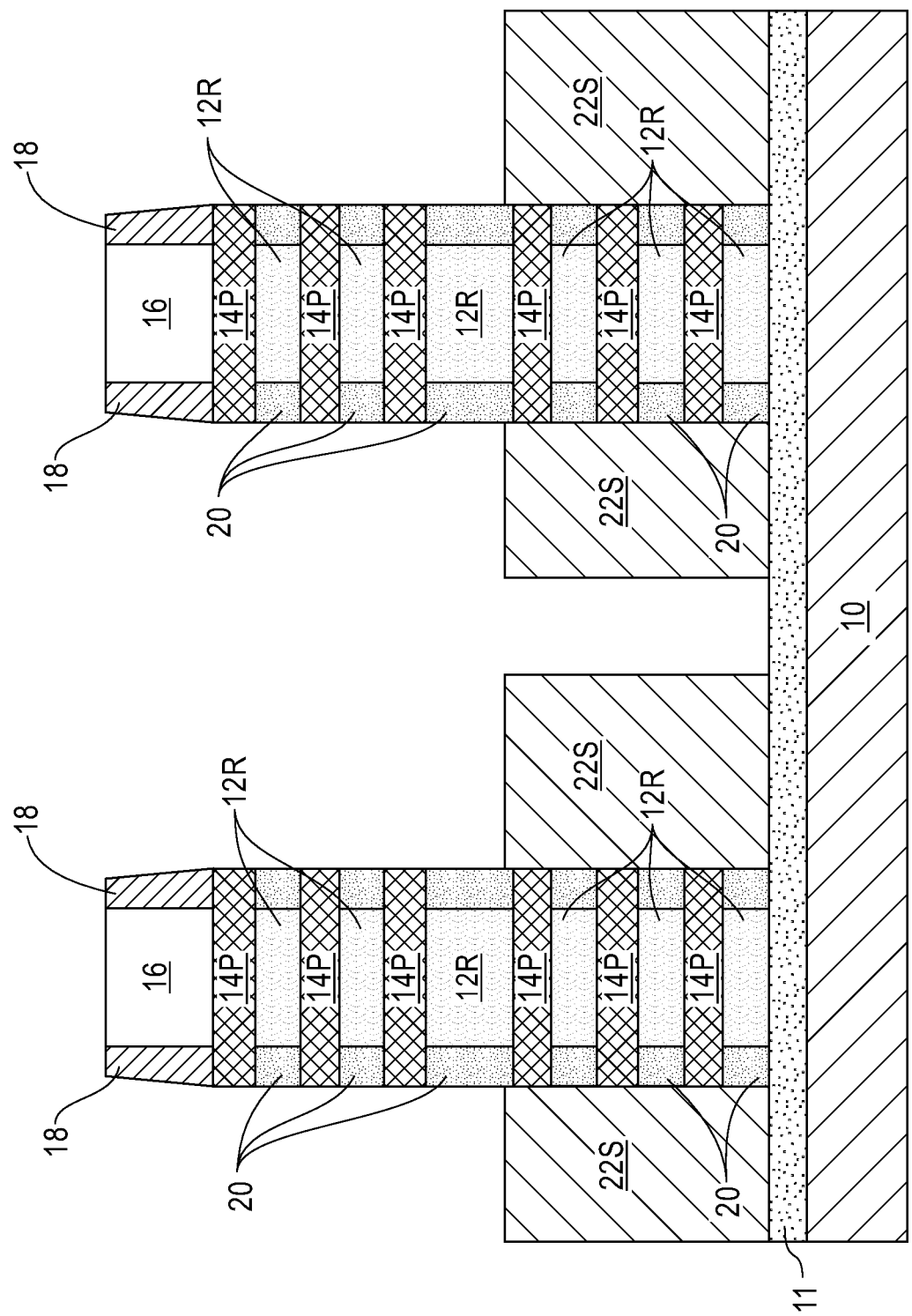
FIG. 5 is a cross sectional view of the exemplary semiconductor structure of FIG. 4 after removing the pFET S/D semiconductor material from the sidewalls of each Si channel material nanosheet in the second nanosheet stack, while maintaining pFET S/D semiconductor material on the physically exposed sidewalls of each Si channel material nanosheet of the first nanosheet stack.

Referring now to FIG. 5, there is illustrated the exemplary semiconductor structure of FIG. 4 after removing the pFET S/D semiconductor material 22 from the sidewalls of each Si channel material nanosheet 14P in the second nanosheet stack, NS2, while maintaining pFET S/D semiconductor material 22 on the physically exposed sidewalls of each Si channel material nanosheet 14P of the first nanosheet stack, NS1. The remaining portion of the pFET S/D semiconductor material 22 can be referred to herein as a pFET S/D region 22S.

The removal of the pFET S/D semiconductor material 22 from the sidewalls of each Si channel material nanosheet 14P in the second nanosheet stack, NS2, can be performed utilizing a recess etching process that is selective for removing pFET S/D semiconductor material 22. The height of each pFET S/D region 22S is above a topmost surface of the topmost Si channel material nanosheet 14P of the first nanosheet stack, NS1, and beneath a topmost surface of the bottommost recessed sacrificial SiGe nanosheet 12R in the second nanosheet stack, NS2.

Figure 6:
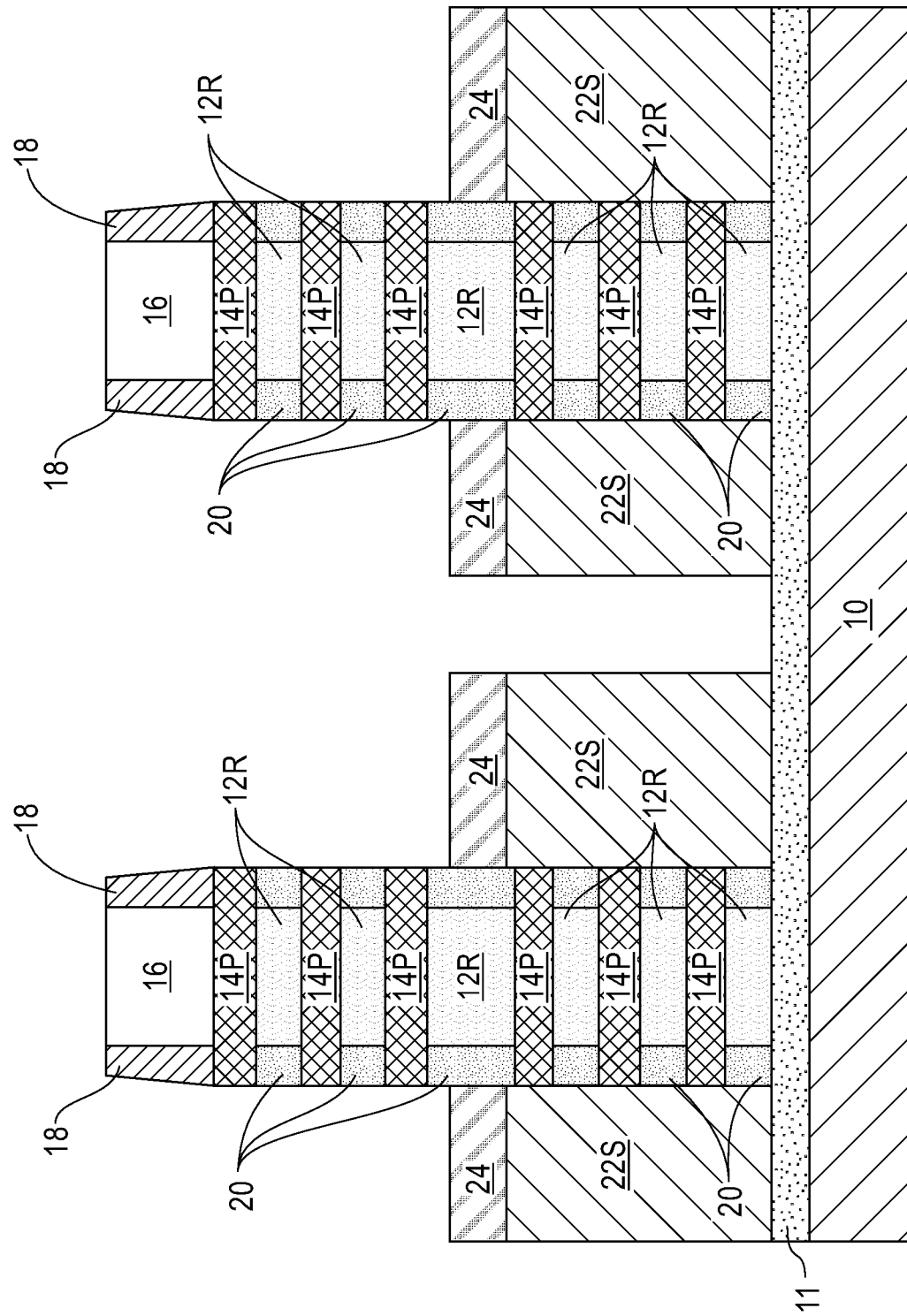
FIG. 6 is a cross sectional view of the exemplary semiconductor structure of FIG. 5 after forming a dielectric material on a physically exposed topmost surface of the maintained pFET S/D semiconductor material.

Referring now to FIG. 6, there is illustrated the exemplary semiconductor structure of FIG. 5 after forming a dielectric material 24 on a physically exposed topmost surface of the maintained pFET S/D semiconductor material 22 (i.e., the pFET S/D regions 22S). The dielectric material 24 may be the same as, or different from, the dielectric material that provides the dielectric isolation layer 11. In one example, the dielectric material 24 is composed of silicon dioxide. The dielectric material 24 may be formed by a deposition process such as, for example, CVD, PECVD, ALD or PVD. The dielectric material 24 has a thickness that is typically from 5 nm to 50 nm. Other thicknesses are also contemplated for the dielectric material 24 and are thus not excluded from being used.

Figure 7:
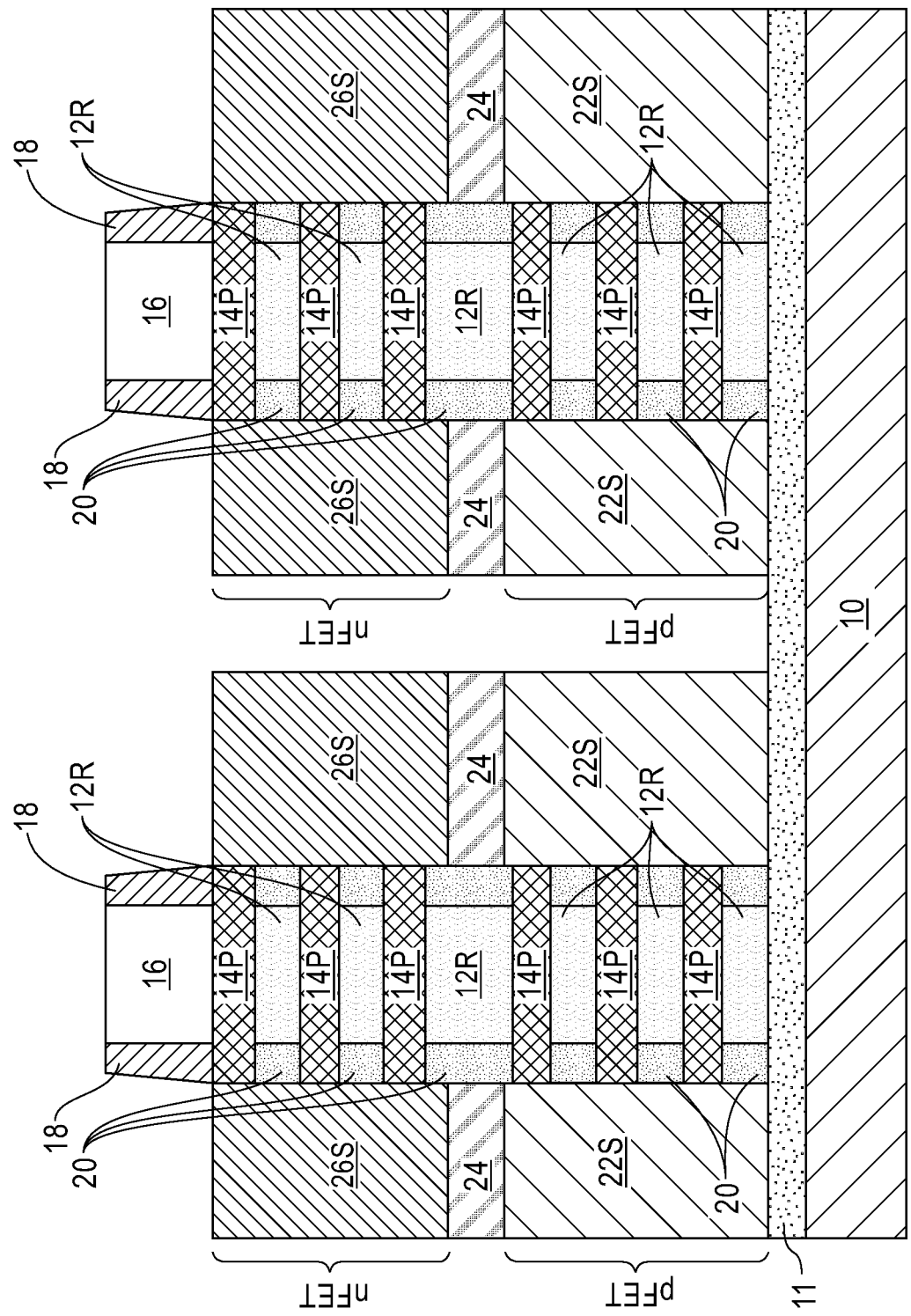
FIG. 7 is a cross sectional view of the exemplary semiconductor structure of FIG. 6 after forming an nFET S/D region by epitaxial growth of a semiconductor material on physically exposed sidewalls of each Si channel material nanosheet of the second nanosheet stack and atop the dielectric material.

Referring now to FIG. 7, there is illustrated the exemplary semiconductor structure of FIG. 6 after forming an nFET S/D region 26S by epitaxial growth of a semiconductor material on physically exposed sidewalls of each Si channel material nanosheet 14P of the second nanosheet stack, NS2, and atop the dielectric material 24. The nFET S/D region 26S is formed on each side of the second nanosheet stack, NS2.

Each nFET S/D region 26S includes a semiconductor material and an n-type dopant. The semiconductor material that provides each nFET S/D region 26S typically comprises a same semiconductor material as that which provides each Si channel material nanosheet 14P. In other embodiments of the present application, the semiconductor material that provides each nFET S/D region 26S may comprise a different semiconductor material than that which provides each Si channel material nanosheet 14P.

The term "n-type dopant" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each nFET S/D region 26S can be introduced into the precursor gas that provides each nFET S/D region 26S. In another embodiment, the dopant can be introduced into an intrinsic semiconductor layer by utilizing one of ion implantation or gas phase doping. In one example, each nFET S/D region 26S comprises silicon that is doped with phosphorus (i.e., P doped Si). As mentioned above, each nFET S/D region 26S is formed by an epitaxial growth (or deposition) process, as is defined above.

The height of the nFET S/D regions 26S may be above, coplanar with, or beneath a topmost surface of the topmost Si channel material nanosheet 14P of the second nanosheet stack, NS2, but not lower than the bottommost surface of the topmost Si channel material nanosheet 14P of the second nanosheet stack, NS2.

Figure 8:
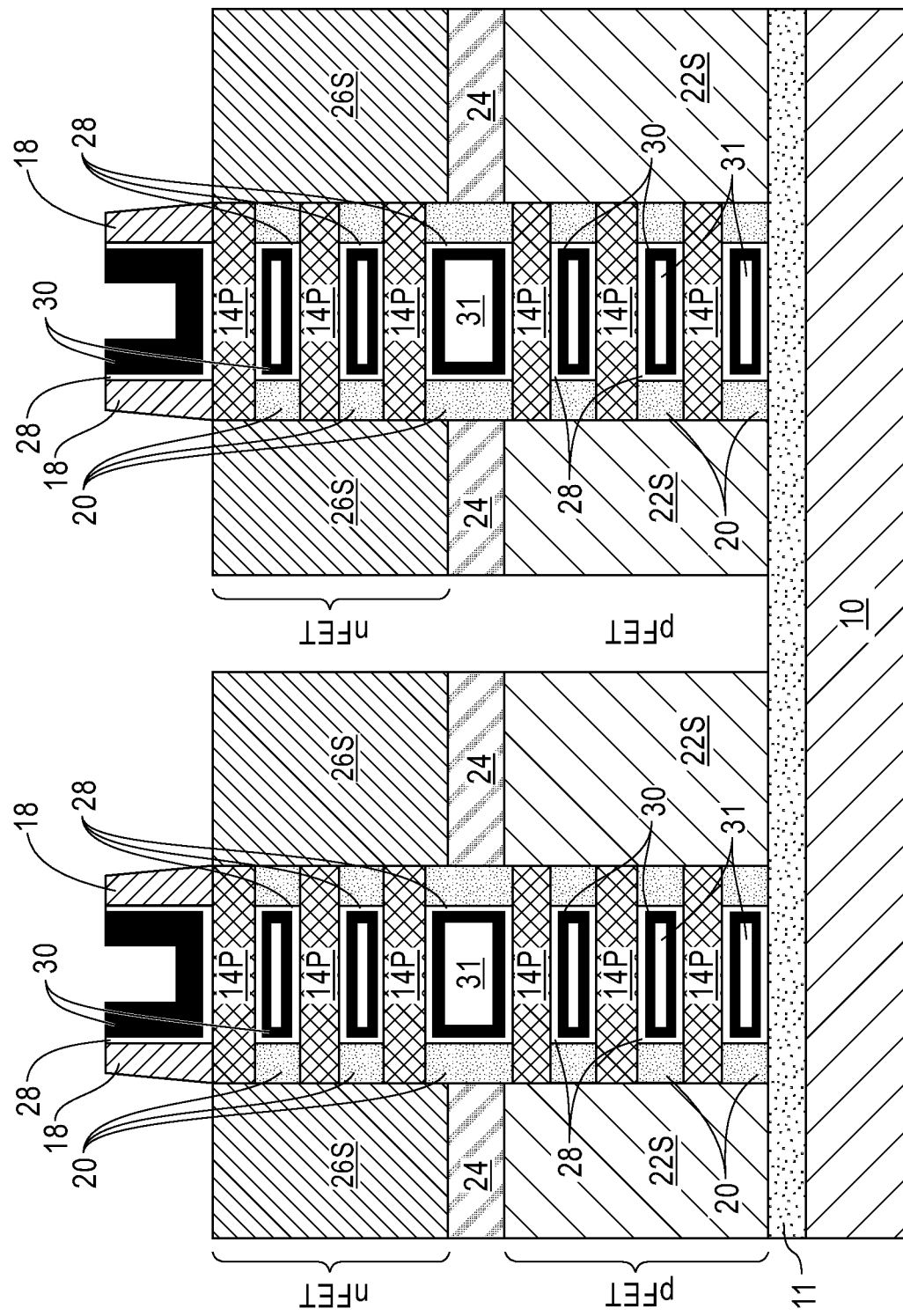
FIG. 8 is a cross sectional view of the exemplary semiconductor structure of FIG. 7 after removing each sacrificial gate structure and each sacrificial SiGe nanosheet, and forming a gate dielectric material and a p-type work function metal.

Referring now to FIG. 8, there is illustrated the exemplary semiconductor structure of FIG. 7 after removing each sacrificial gate structure 16 and each recessed sacrificial SiGe nanosheet 12R, and forming a gate dielectric material 28 and a p-type work function metal 30.

The sacrificial gate structure 16 can be removed utilizing one or more anisotropic etching processes that are selective in removing the materials that provide the sacrificial gate structure 16. Next, each Si channel material nanosheet 14P is suspended by selectively etching each recessed sacrificial SiGe nanosheet 12R relative to each Si channel material nanosheet 14P. A gate cavity is formed by removing the sacrificial gate structure 16 and each recessed sacrificial SiGe nanosheet 12R. The gate cavity is present above, beneath and around each suspended Si channel material nanosheet 14P. Vertically stacked and suspended Si channel material nanosheets 14P of the first nanosheet stack, NS1, are provided and define a pFET device region, while vertically stacked and suspended Si channel material nanosheets 14P of the second nanosheet stack, NS2, are provided and define an nFET device region. The nFET device region is vertically stacked above the pFET device region.

A gate dielectric material 28 is then formed into gate cavity. The gate dielectric material 28 is present on physically exposed surfaces of each Si channel material nanosheet 14P. The gate dielectric material 28 is also present on inner sidewalls of the dielectric spacer 18 and the inner spacers 20. The gate dielectric material 28 does not occupy the entire volume of the gate cavity.

The gate dielectric material 28 can be an oxide, nitride, and/or oxynitride. In one example, the gate dielectric material 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric 28.

The gate dielectric material 28 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 28 can have a thickness in a range from 1 nm to 10 nm. Other thicknesses that are lesser than, or greater than, the aforementioned thickness range can also be employed for the gate dielectric material 28.

Next, a p-type work function metal 30 is formed on the gate dielectric material 28 in the gate cavity. The p-type work function metal 30 does not occupy the entire volume of the gate cavity. In portions of the gate cavity that are between each Si channel material nanosheet 14P and in both the nFET device region and the pFET device region, a seam (i.e., air gap) 31 remains after the formation of the gate dielectric material 28 and the p-type work function metal 30.

The p-type work-function metal 30 that is employed is a metal nitride stack of ALD TiN and CVD TiN. In such an embodiment, the ALD TiN (typically thickness from 0.2 nm to 2 nm) is formed first on exposed surfaces of the gate dielectric material 28 followed by the CVD nitride (typically thickness from 1 nm to 3 nm). The CVD nitride encapsulates each Si channel material nanosheet 14P and forms a seam 31 between each of the Si channel material nanosheets 14P. This seam 31 enables the subsequent removal of TiN from the Si channel material nanosheets 14P within the second nanosheet stack, NS2, with a small wet etching budget. This seam 31 will remain in the pFET device region.

Figure 9:
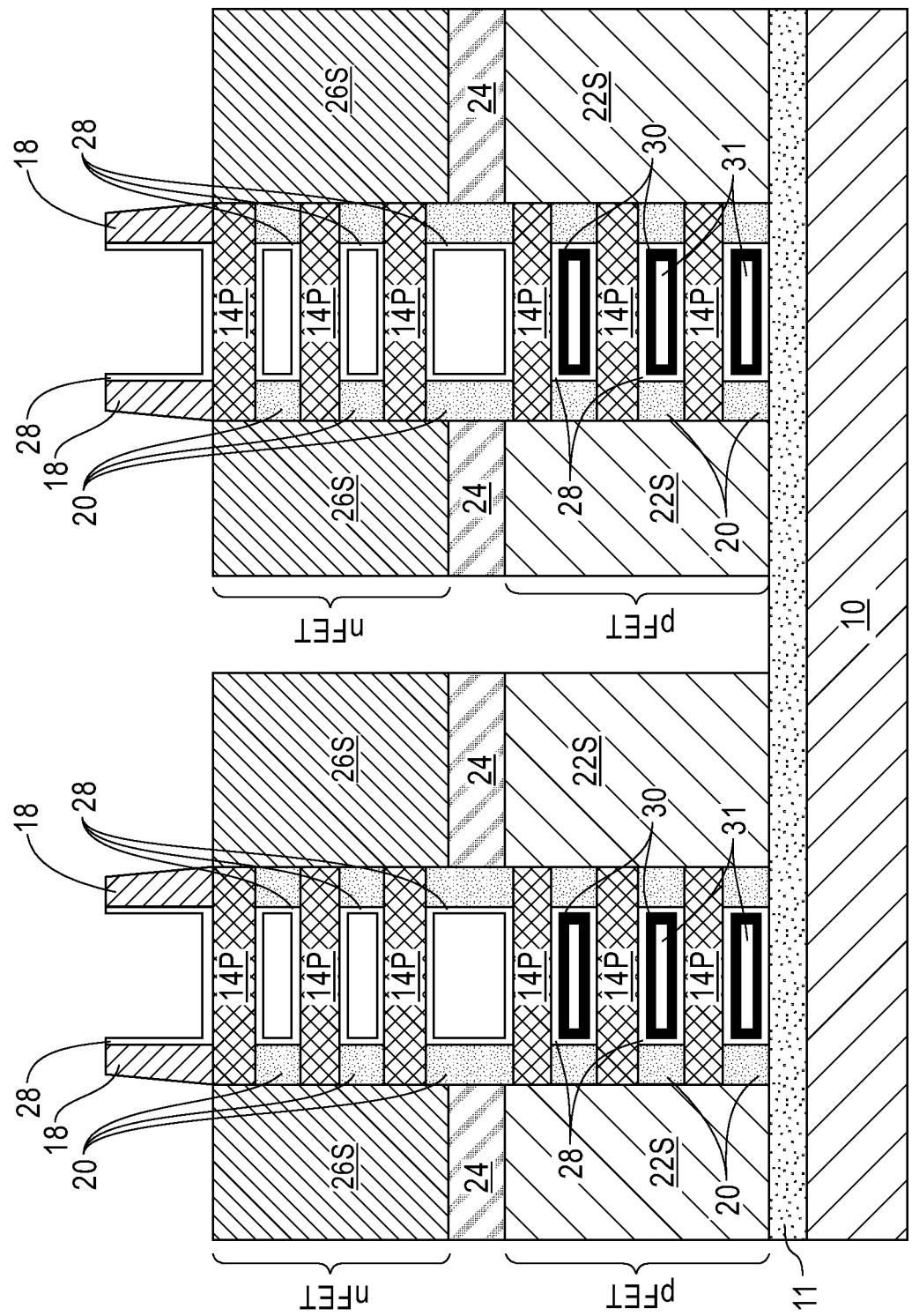
FIG. 9 is a cross sectional view of the exemplary semiconductor structure of FIG. 8 after removing the p-type work function metal from each Si channel material nanosheet of the second nanosheet stack.

Referring now to FIG. 9, there is illustrated the exemplary semiconductor structure of FIG. 8 after removing the p-type work function metal 30 from each Si channel material nanosheet 14P of the second nanosheet stack, NS2. The removal of the p-type work function metal 30 from each Si channel material nanosheet 14P of the second nanosheet stack, NS2, can be performed utilizing a wet etch process in which a chemical etchant that is selective in removing the p-type work function metal 30 can be used.

In some embodiments, a sacrificial material (not shown) such as, for example, an organic planarization material, is formed first filling in any vertical trenches between different vertically stacked device regions, and then the sacrificial material is recessed to the top of dielectric material 24. Next, the removal of the p-type work function metal 30 from each Si channel material nanosheet 14P of the second nanosheet stack, NS2, can be performed. After the removal of the p-type work function metal 30 from each Si channel material nanosheet 14P of the second nanosheet stack, NS2, the sacrificial material may be removed from the structure.

Figure 10:
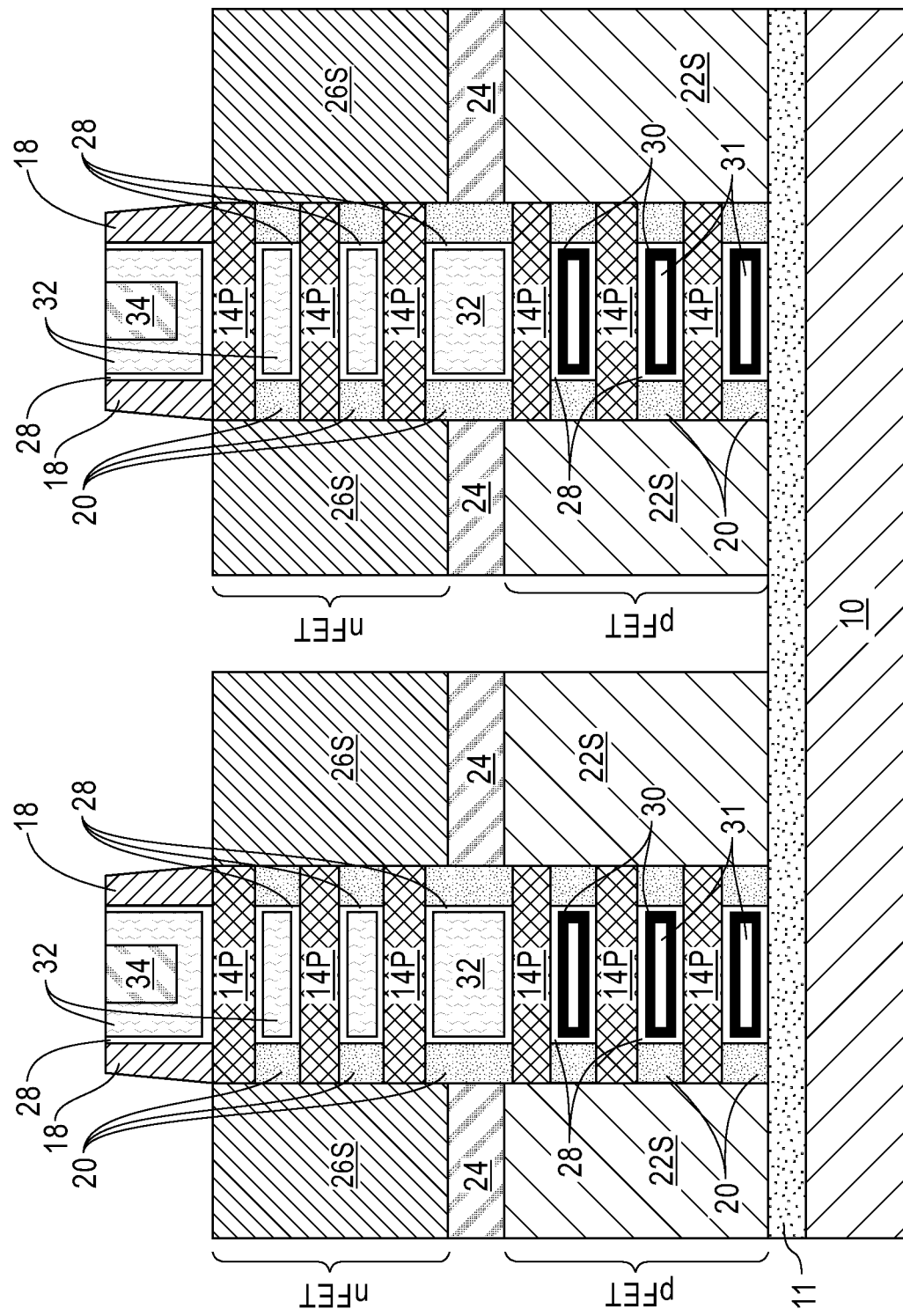
FIG. 10 is a cross sectional view of the exemplary semiconductor structure of FIG. 9 after forming an n-type work function metal around each Si channel material nanosheet of the second nanosheet stack, and forming a metal-containing structure.

Referring now to FIG. 10, there is illustrated the exemplary semiconductor structure of FIG. 9 after forming an n-type work function metal 32 in the gate cavity in the nFET device region, and forming a metallic structure 34 in an upper portion of the gate cavity that is located between the gate spacer 18. The n-type work function metal 32 warps around each Si channel material nanosheet 14P of the second nanosheet stack, NS2, and fills a remaining volume of the gate cavity that is positioned between vertically stacked Si channel material nanosheets 14P of the second nanosheet stack, NS2. No n-type work function metal 32 or metallic structure 34 are formed in the pFET device region containing the vertically stacked and suspended Si channel material nanosheets 14P of the first nanosheet stack, NS1.

The n-type work function metal 32 may include hafnium, zirconium, titanium, tantalum, aluminum, metal carbides (e.g., hafnium carbide, zirconium carbide, titanium carbide, and aluminum carbide), aluminides, or any combination thereof. In one embodiment, the n-type work function metal 32 may include a material stack of TiN/Al-containing alloy/TiN. The n-type work function metal 32 can be formed utilizing a deposition process such as, for example, CVD, PECVD or ALD. The n-type work function metal 32 typically has a thickness from 1 nm to 10 nm.

The metallic structure 34 is formed by deposition of a metal or metal alloy having a lower resistivity than the n-type work function metal 32. In one embodiment, the metal or metal alloy is tungsten or cobalt. The metallic structure 34 can be formed by deposition of the low resistivity metal or metal alloy, followed by planarization.

In FIG. 10, nFET devices are shown vertically stacked above pFET devices. Each pFET device includes a first functional gate structure present on physically exposed surfaces, and between, each Si channel material nanosheet of a first set of vertically stacked and suspended Si channel material nanosheets (i.e., Si channel material nanosheets 14P of the first nanosheet stack, NS1). By "functional gate structure" it is meant a permanent gate structure used to control output current (i.e., flow of carriers in the channel) of a semiconducting device through electrical or magnetic fields.

The first functional gate structure includes gate dielectric material 28 and p-type work function metal 30. A seam (or air gap) 31 is present between each Si channel material nanosheet 14P of the first set of vertically stacked and suspended Si channel material nanosheets. pFET S/D regions 22S are present on physically exposed sidewalls of each Si channel material nanosheet 14P of the first set of vertically stacked and suspended Si channel material nanosheets.

Each nFET device includes a second functional gate structure present on physically exposed surfaces, and between, each Si channel material nanosheet of a second set of vertically stacked and suspended Si channel material nanosheets (i.e., Si channel material nanosheets 14P of the second nanosheet stack, NS2). The second functional gate structure includes gate dielectric material 28 and n-type work function metal 32. nFET S/D regions 26S are present on physically exposed sidewalls of each Si channel material nanosheet 14P of the second set of vertically stacked and suspended Si channel material nanosheets. A dielectric material 24 electrically isolates the pFET S/D regions 22S from the nFET S/D regions 26S.

In the present application, the first and second functional gate structures comprise a gate dielectric material 28, wherein the gate dielectric material 28 of the first functional gate structure surrounds the p-type work function metal 30 and wherein the gate dielectric material 28 of the second functional gate structure surrounds the n-type work function metal 32.

Figure 11:
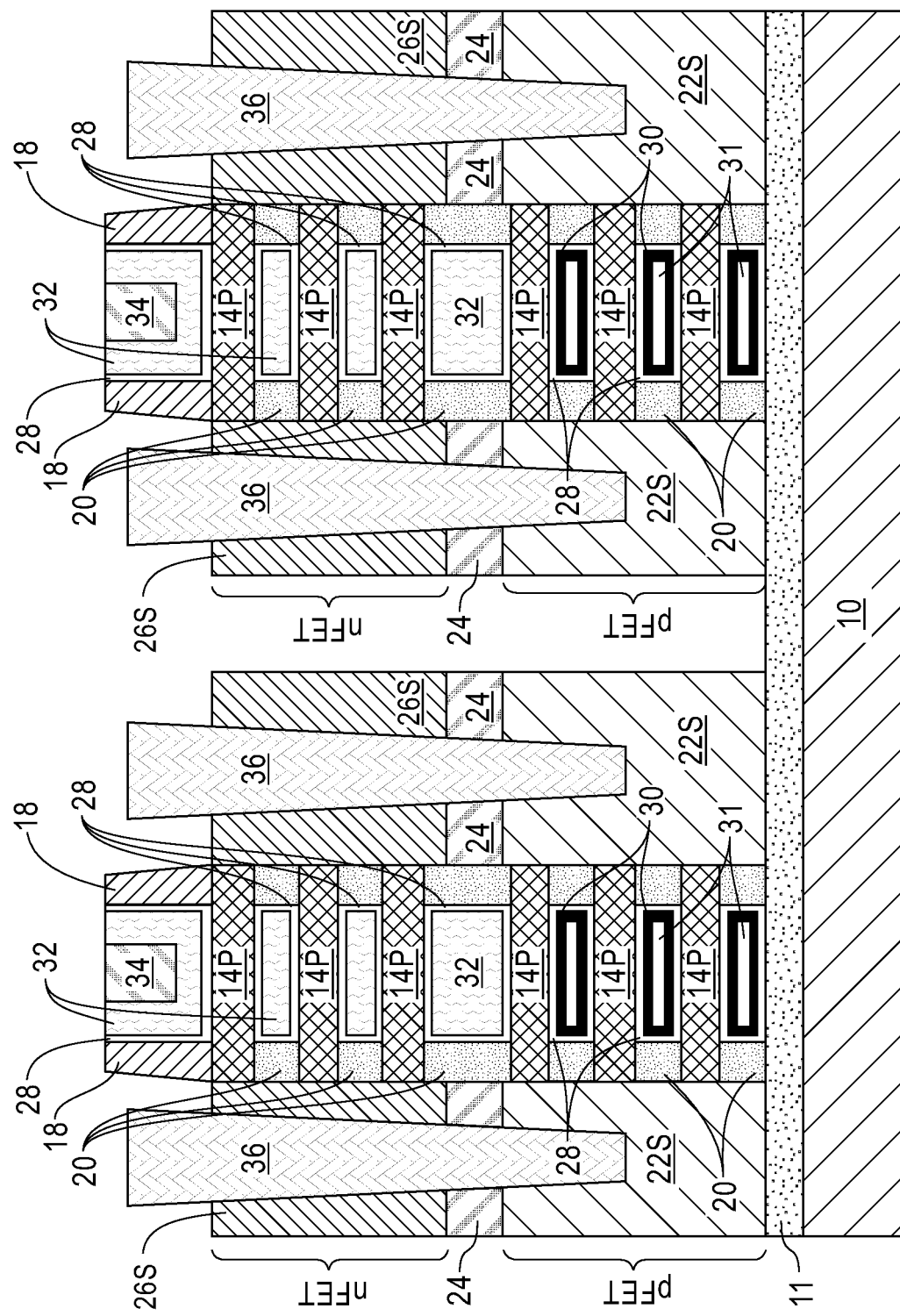
FIG. 11 is a cross sectional view of the exemplary semiconductor structure of FIG. 10 after forming first S/D contact structures in contact openings that are formed through the nFET S/D region, the dielectric material and a portion of the maintained pFET S/D semiconductor material.

Referring now to FIG. 11, there is illustrated the exemplary semiconductor structure of FIG. 10 after forming first S/D contact structures 36 in contact openings that are formed through the nFET S/D regions 26S, the dielectric material 24 and a portion of the maintained pFET S/D semiconductor material (i.e., the pFET S/D regions 22S). A first contact structure 36 is formed on each side of the vertically stacked and suspended Si channel material nanosheets 14P of the first and second nanosheet stacks (NS1, NS2).

The contact openings can be formed by lithography and etching. The first S/D contact structures 36 can include a contact metal (such as, for example, W, Al or Cu) or metal alloy (such as, for example Cu—Al). The first S/D contact structures 36 can be formed by depositing a contact metal or metal alloy.

Figure 12:
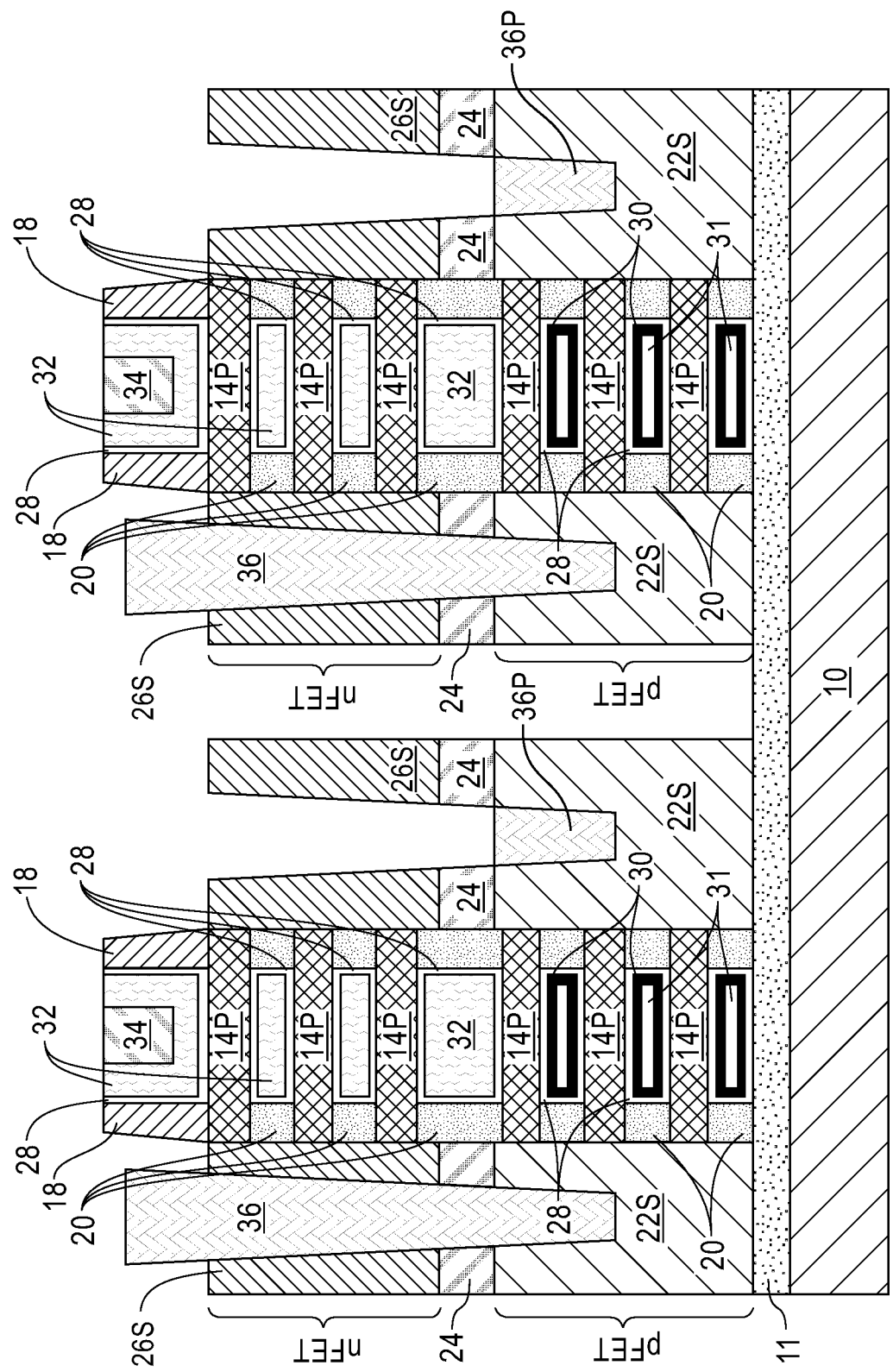
FIG. 12 is a cross sectional view of the exemplary semiconductor structure of FIG. 11 after removing the first S/D contact structure from an upper portion of a physically exposed first contact opening that is located on one side of the vertically stacked and suspended Si channel material nanosheets.

Referring now to FIG. 12, there is illustrated the exemplary semiconductor structure of FIG. 11 after removing the first S/D contact structure 36 from an upper portion of a first contact opening that is located on one side of the vertically stacked and suspended Si channel material nanosheets 14P such that the upper portion of the first contact opening in the nFET device region is not filled at this point within any contact metal or metal alloy. A portion of the first S/D contact structure 36 remains in a bottom portion of the physically exposed first contact opening. The remaining portion of the first S/D contact structure 36 may be referred to herein as a pFET S/D contact structure 36P.

This step of the present application may be performed by first providing a block mask over portions of the exemplary structure not including a first S/D contact structure 36 to further process. An etch is then performed to remove the first S/D contact structure 36 from an upper portion of each physically exposed first contact opening. In some embodiments, this step may be omitted.

Figure 13:
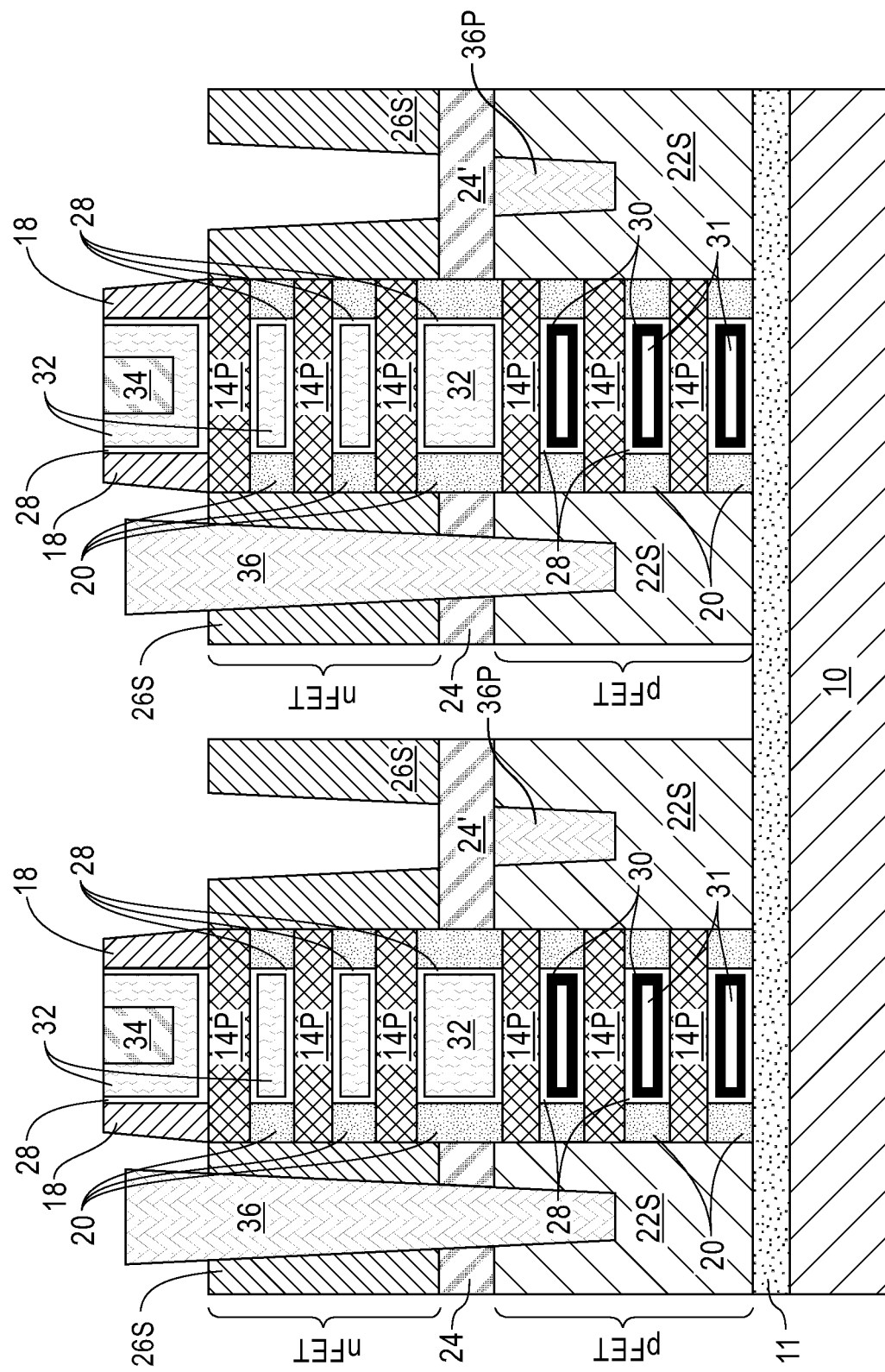
FIG. 13 is a cross sectional view of the exemplary semiconductor structure of FIG. 12 after forming additional dielectric material in the physically exposed first contact opening.

Referring now to FIG. 13, there is illustrated the exemplary semiconductor structure of FIG. 12 after forming additional dielectric material in the physically exposed first contact opening. The additional dielectric material is compositionally the same as the dielectric material that provides dielectric material 24. Since the original dielectric material 24 and the additional dielectric material are compositionally the same, reference numeral 24' is used to designate the original dielectric material 24 and the additional dielectric material that is formed during this step of the present application. The additional dielectric material may be formed utilizing one of the deposition techniques mentioned above for forming dielectric material 24. A recess etch may or may not follow the deposition of the additional dielectric material. The additional dielectric material may have a bottommost surface that is coplanar or located beneath a bottommost surface of dielectric material 24 and/or the additional dielectric material may have a topmost surface that is coplanar, located beneath, or located above a topmost surface of dielectric material 24.

Figure 14:
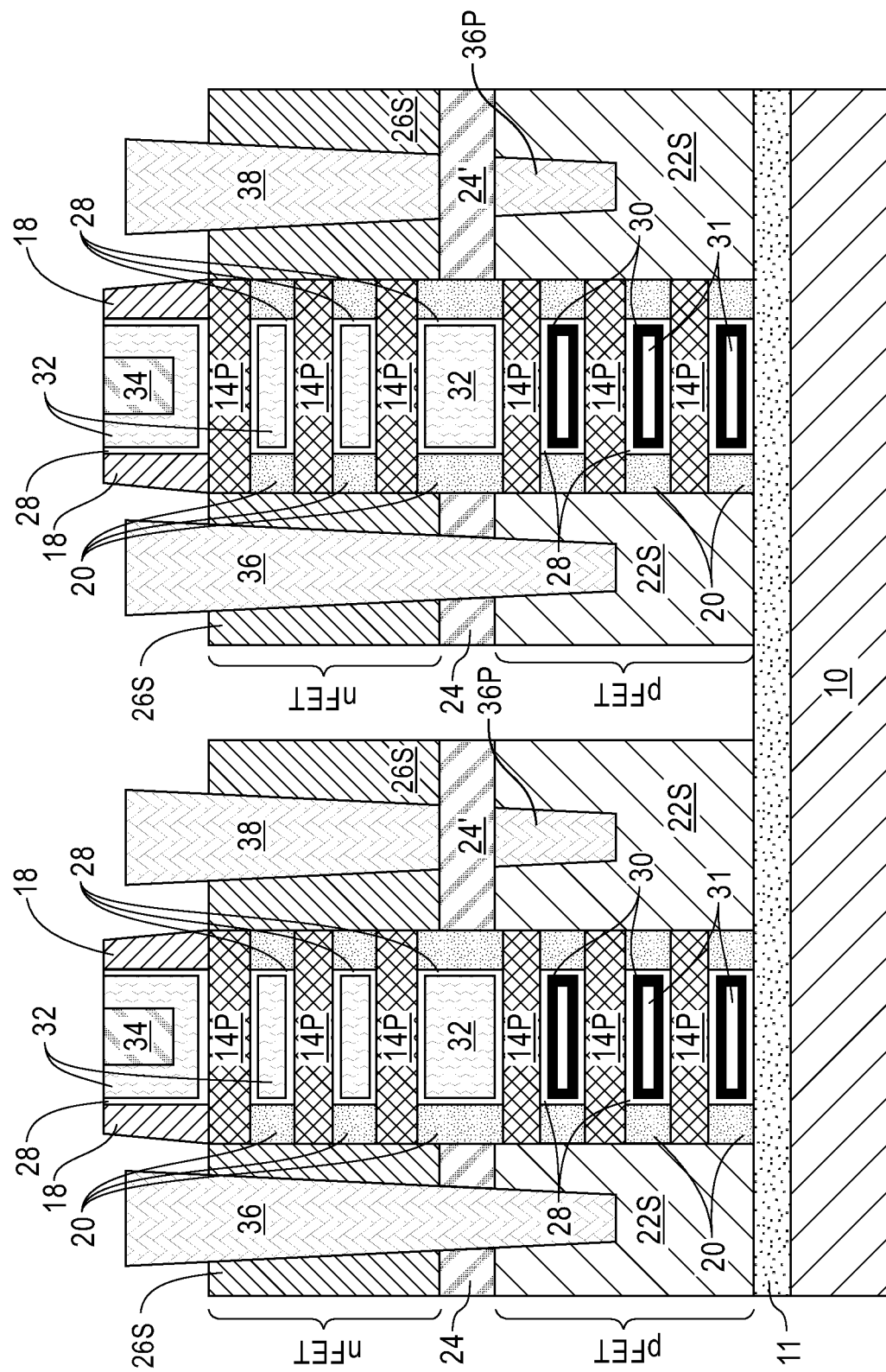
FIG. 14 is a cross sectional view of the exemplary semiconductor structure of FIG. 13 after forming a second S/D contact structure in the physically exposed first contact opening and on the additional dielectric material.

Referring now to FIG. 14, there is illustrated the exemplary semiconductor structure of FIG. 13 after forming a second S/D contact structure 38 in the physically exposed first contact opening and on the additional dielectric material. The second S/D contact structure 38 may include one of the contact metals or metal alloys mentioned above for first S/D contact structure 36. The contact metal or metal alloy that provides the second S/D contact structure 38 may be the same as, or different from, the contact metal or metal alloy that provides the first S/D contact structure 36. The second S/D contact structure 38 can be formed by deposition. The second S/D contact structure 38 may be referred to herein an nFET S/D contact structure.

In the illustrated embodiment, the nFET S/D region 26S and the pFET S/D region 22S shown to the left of each vertically stacked and suspended Si channel material nanosheet 14P share a common S/D contact structure, i.e., first contact structure 36. To the right of each vertically stacked and suspended Si channel material nanosheet 14P, the nFET S/D region 26S has its' own contact structure, i.e., nFET S/D contact structure 38, while the pFET S/D region has its' own contact structure, i.e., pFET S/D contact structure 36P.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a pFET device comprising a first functional gate structure containing at least a p-type work function metal and present on physically exposed surfaces, and between, each Si channel material nanosheet of a first set of vertically stacked and suspended Si channel material nanosheets; and
an nFET device stacked vertically above the pFET device and comprising a second functional gate structure containing at least an n-type work function metal present on physically exposed surfaces, and between, each Si channel material nanosheet of a second set of vertically stacked and suspended Si channel material nanosheets, wherein a seam is present between each Si channel material nanosheet of the first set of vertically stacked and suspended Si channel material nanosheets, and the seam is surrounded by the p-type work function metal.

2. The semiconductor structure of claim 1, further comprising pFET S/D regions present on physically exposed sidewalls of each Si channel material nanosheet of the first set of vertically stacked and suspended Si channel material nanosheets, and nFET S/D regions present on physically exposed sidewalls of each Si channel material nanosheet of the second set of vertically stacked and suspended Si channel material nanosheets.

3. The semiconductor structure of claim 2, further comprising a dielectric material located between each pFET S/D region and each nFET S/D region.

4. The semiconductor structure of claim 2, further comprising a shared S/D contact structure located on a first side of the vertically stacked nFET and pFET devices.

5. The semiconductor structure of claim 4, wherein the shared contact structure passes through one of the nFET S/D regions and into one of the underlying pFET S/D regions.

6. The semiconductor structure of claim 1, wherein the p-type work function metal comprises TiN.

7. The semiconductor structure of claim 1, further comprising a dielectric isolation layer located beneath the pFET device, the dielectric isolation layer is located on a surface of a semiconductor substrate.

8. The semiconductor structure of claim 1, further comprising a metallic structure located above a topmost Si channel material nanosheet of the second set of vertically stacked and suspended Si channel material nanosheets.

9. The semiconductor structure of claim 8, wherein the metallic structure is composed of a metal or metal alloy having a lower resistivity than the n-type work function metal.

10. The semiconductor structure of claim 9, wherein the n-type work function metal includes a stack of TiN/Al-containing alloy/TiN, and the metallic structure is composed of tungsten or cobalt.

11. The semiconductor structure of claim 1, wherein the first and second functional gate structures comprise a gate dielectric material, wherein the gate dielectric material of the first functional gate structure surrounds the p-type work function metal and wherein the gate dielectric material of the second functional gate structure surrounds the n-type work function metal.

12. The semiconductor structure of claim 1, wherein the p-type work function metal comprises a metal nitride stack of atomic layer deposited TiN and chemical vapor deposited TiN.

13. The semiconductor structure of claim 12, wherein the chemical vapor deposited TiN encapsulates each Si channel material nanosheet of the first set of vertically stacked and suspended Si channel material nanosheets.

14. The semiconductor structure of claim 1, further comprising an inner spacer located between end segments of each Si channel material nanosheet of the first and second sets of vertically stacked and suspended Si channel material nanosheets.

15. The semiconductor structure of claim 14, wherein the inner spacer has an outermost sidewalls that is vertically aligned to an outermost sidewall of each Si channel material nanosheet of the first and second sets of vertically stacked and suspended Si channel material nanosheets.

16. The semiconductor structure of claim 1, wherein each Si channel material nanosheet of the first and second sets of vertically stacked and suspended Si channel material nanosheets is composed of unalloyed silicon.

17. The semiconductor structure of claim 1, wherein the n-type work function metal is composed of hafnium, zirconium, titanium, tantalum, or aluminum, a metal carbide, an aluminide or any combination thereof.

* * * * *